(12) United States Patent
Kim

(10) Patent No.: US 8,633,495 B2
(45) Date of Patent: Jan. 21, 2014

(54) NITRIDE SEMICONDUCTOR LIGHT-EMITTING DEVICE AND METHOD OF MANUFACTURING THE SAME

(75) Inventor: Hee-Jin Kim, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 1241 days.

(21) Appl. No.: 11/707,926

(22) Filed: Feb. 20, 2007

(65) Prior Publication Data

US 2007/0194329 A1    Aug. 23, 2007

(30) Foreign Application Priority Data

Feb. 20, 2006    (KR) .................. 10-2006-0016472

(51) Int. Cl.
- H01L 27/15    (2006.01)
- H01L 29/26    (2006.01)
- H01L 31/12    (2006.01)
- H01L 33/00    (2010.01)

(52) U.S. Cl.
USPC 257/79; 257/103; 257/E21.121; 257/E33.005; 257/E33.03; 438/46

(58) Field of Classification Search
USPC ............... 257/79, 103, E21.121, E33.005, 257/E33.03; 438/46
See application file for complete search history.

(56) References Cited

U.S. PATENT DOCUMENTS

| 8,110,851 | B2 | 2/2012 | Yokogawa et al. | |
|---|---|---|---|---|
| 2003/0209704 | A1* | 11/2003 | Yamada | 257/14 |
| 2005/0155694 | A1* | 7/2005 | Sim et al. | 156/81 |
| 2006/0278880 | A1* | 12/2006 | Lee et al. | 257/79 |
| 2006/0286782 | A1* | 12/2006 | Gaska et al. | 438/483 |

FOREIGN PATENT DOCUMENTS

| JP | 7-11430 A | 1/1995 |
|---|---|---|
| JP | 11-274554 A | 10/1999 |
| JP | 4486701 B1 | 6/2010 |

* cited by examiner

Primary Examiner — Meiya Li
(74) Attorney, Agent, or Firm — Birch, Stewart, Kolasch & Birch, LLP

(57) ABSTRACT

There is provided a nitride semiconductor light emitting device. The nitride semiconductor light emitting device comprises a first nitride semiconductor layer including amorphous powder, an active layer on the first nitride semiconductor layer, and a second nitride semiconductor layer on the active layer.

19 Claims, 3 Drawing Sheets

NITRIDE SEMICONDUCTOR LIGHT-EMITTING DEVICE AND METHOD OF MANUFACTURING THE SAME

The present application claims priority under 35 U.S.C. 119 and 35 U.S.C. 365 to Korean Patent Application No. 10-2005-016472 (filed on Feb. 20, 2006), which is hereby incorporated by reference in its entirety.

BACKGROUND OF THE INVENTION

1. Field of the Invention

The present invention relates to a nitride semiconductor light emitting device and a method of manufacturing the same.

2. Description of Related Art

Recently, researches for semiconductor light emitting devices using gallium nitride (GaN) are being actively conducted in the field of conventional nitride semiconductors.

In a conventional nitride semiconductor light emitting device, differences in a lattice constant and a coefficient of thermal expansion may occur between a sapphire substrate and GaN layers grown on the sapphire substrate, so that crystal defect is caused. Therefore, in order to prevent the crystal defect from being caused, a GaN buffer layer is grown on the sapphire substrate at the lower temperature condition and the GaN layers are grown on the buffer layer at the high temperature condition. This is for reducing a difference in the lattice constant between the sapphire substrate and the GaN layers.

In the conventional nitride semiconductor, in order to grow dislocation free GaN layers on the buffer layer, a lateral epitaxial overgrowth (LEO) method or a pendeo-epitaxy method is used. In the above two methods, the GaN layers are grown from side to side to prevent the defect formed in the interface between the sapphire substrate and the GaN layers from moving to an upper layer.

FIGS. 1A to 1D illustrate a method of growing the GaN layers using the conventional LEO method.

In the LEO method, as illustrated in FIG. 1A, after primarily growing a GaN epitaxial layer 11 on the top surface of a sapphire substrate 10, as illustrated in FIG. 1B, masks 12 having a predetermined pattern are formed on the top surface of the primarily grown epitaxial layer 11, wherein the masks 12 are made of a silicon oxide layer or a silicon nitride layer.

Then, as illustrated in FIG. 1C, GaN layers 13 are re-grown in the parts where the masks 12 are not formed. At this time, the GaN layers 13 are grown on the masks 12 from side to side as illustrated in FIG. 1C by arrows. When the from side to side growth of the GaN layers 13 is completed, as illustrated in FIG. 1D, the growth of the GaN layers 13 is completed.

On the other hand, in the conventional pendeo-epitaxy method, an etching process of forming a mask to remove the GaN epitaxial layer on which the mask is not formed is added to the LEO method illustrated in FIGS. 1A to 1D. In the GaN layer formed by the LEO method or the pendeo-epitaxy method, the transmission of dislocation is commonly reduced.

As illustrated in FIG. 2, in the part where the primarily grown epitaxial layer 11 is exposed, the dislocation A that exists below is transmitted to the GaN layers 13 re-grown later. However, since the growth is performed from side to side in the parts covered with the masks 12, no dislocation is transmitted from below so that defect is reduced.

However, when the GaN layers are grown by the conventional method, the dislocation A of the part that is not covered with the mask is transmitted to above and dislocation B of high density is generated in the adhesion surface where the GaN layers 13 re-grown from side to side meet each other.

Also, according to the conventional art, defect is generated by stress formed between the masks 12 and the re-grown GaN layers 13. The electrical and optical characteristics of the nitride semiconductor and yield deteriorate by the defect such as dislocation.

Also, in the conventional LEO method or the pendeo-epitaxy method, since a process of creating the masks is used, manufacturing expenses increase. Also, since a pattern work and a re-growing process are added after primarily growing the GaN epitaxial layer, manufacturing processes are complicated.

As described above, according to the conventional art, although the LEO method or the pendeo-epitaxy method is used in order to reduce the defect caused by lattice mismatching, it is not possible to remarkably reduce the defect such as the dislocation. Also, the processes become complicated due to the addition of processes and the manufacturing expenses increase. Therefore, it is required to provide a gallium nitride (GaN) semiconductor light emitting device having excellent electrical and optical characteristics in which it is possible to prevent the defect such as the dislocation from being generated by the lattice mismatching between the sapphire substrate and the nitride semiconductor material such as GaN and a method of manufacturing the same.

SUMMARY OF THE INVENTION

An embodiment of the present invention provides a nitride semiconductor light emitting device having excellent electrical and optical characteristics in which defect such as the dislocation of a nitride semiconductor light emitting device is prevented and a method of manufacturing the same.

Also, the embodiment of the present invention provides a nitride semiconductor light emitting device that is manufactured by simple manufacturing processes without complicated manufacturing processes performed by a lateral epitaxial overgrowth (LEO) method or a pendeo-epitaxy method and a method of manufacturing the same.

An embodiment of the present invention provides a nitride semiconductor light emitting comprising a first nitride semiconductor layer including amorphous powders, an active layer on the first nitride semiconductor layer, and a second nitride semiconductor layer on the active layer.

Another embodiment of the present invention provides a method of manufacturing a nitride semiconductor light emitting device comprising forming amorphous powder on a substrate, forming a first nitride semiconductor layer on the substrate, forming an active layer on the first nitride semiconductor layer and forming a second nitride semiconductor layer on the active layer.

DETAILED DESCRIPTION OF THE INVENTION

Hereinafter, a nitride semiconductor light emitting device according to embodiments of the present invention and a method of manufacturing the same will be described with reference to the attached drawings.

In the nitride semiconductor light emitting device according to the embodiment of the present invention, for example, a light emitting device having a multiple quantum well (MQW) structure is described. However, the nitride semiconductor light emitting device is not limited to the light emitting device having the MQW structure.

According to the embodiment of the present invention, when a layer is referred to as being "on/under" another layer, it can be directly "on/under" the other layer, or intervening layers may also be present.

(First Embodiment)

FIGS. 3 to 8 are sectional views illustrating the processes of a method of manufacturing a nitride semiconductor light emitting device according to a first embodiment of the present invention.

Figure 3:
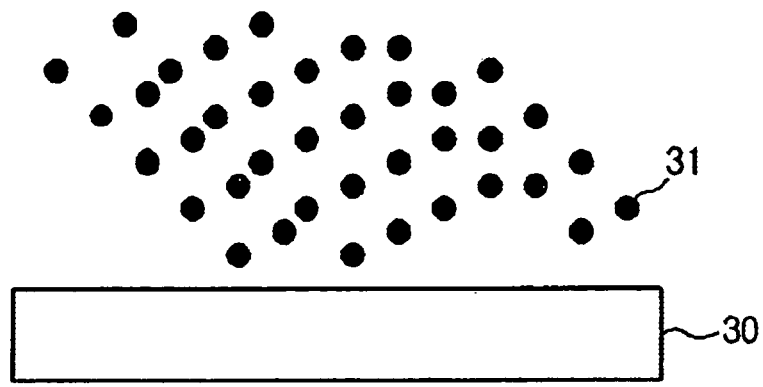
FIGS. 3 to 8 are sectional views illustrating the processes of a method of manufacturing a nitride semiconductor light emitting device according to a first embodiment of the present invention.

First, as illustrated in FIG. 3, amorphous powders 31 are sprayed onto a substrate 30. The amorphous powders 31 can be mechanically sprayed.

Here, the substrate 30 is preferably an insulating substrate such as a sapphire substrate.

Also, the amorphous powders 31 include Fe based amorphous powders. For example, the amorphous powders 31 can be powders having a composition of Fe—Si—B formed using a ball milling method.

The amorphous powders 31 of each grain having the size of about 5 μm to 10 μm are sprayed onto the substrate 30 so that the distribution density of the amorphous powders 31 occupies about 20% to 40% for the area of the substrate 30 and that the amorphous powders can be combined with the substrate 30.

Figure 4:
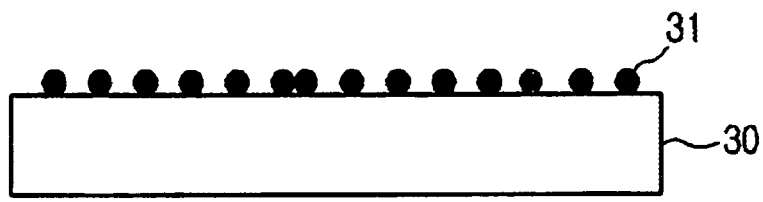

Then, as illustrated in FIG. 4, when the amorphous powders 31 are sprayed onto the substrate 30, the grains of the amorphous powders 31 are non-uniformly distributed on the substrate 30. In this state, heat treatment is performed at the atmosphere of a low temperature (about 400° C. to 900° C.) or a high temperature (about 950° C. to 1,500° C.), preferably, at the temperature of about 400° C. to 900° C. or 1,100° C. to 1,200° C. for about 10 to 15 minutes. Therefore, the amorphous powders 31 are combined with the top surface of the substrate 30 in a non-uniform state.

Of course, an electromagnetic field is generated in the sapphire substrate 30 to uniformly distribute the grains of the amorphous powders 31 by the electromagnetic field so that the grains of the Fe based amorphous powders 31 can be uniformly distributed.

Figure 5:
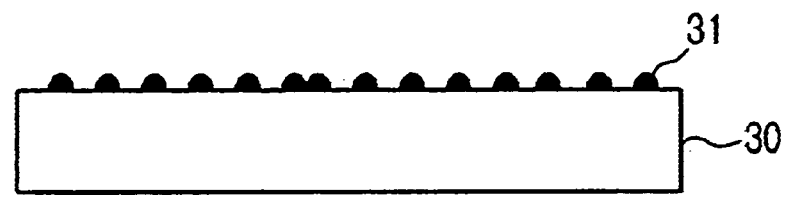

Then, when heat treatment is performed as illustrated in FIG. 5, the grains of the amorphous powders 31 become semi-liquid on the substrate 30 to become semi-spherical so that the grains of the amorphous powders 31 become solid in the semi-spherical form and in the semi-liquid state.

Figure 6:
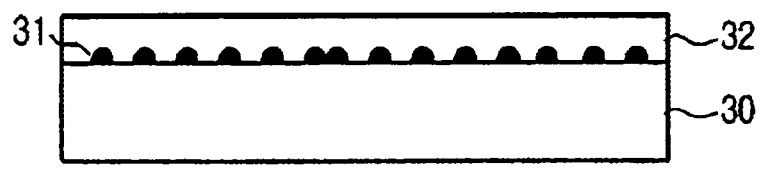
Figure 7:
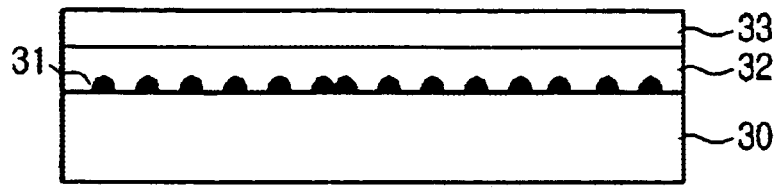
Figure 8:
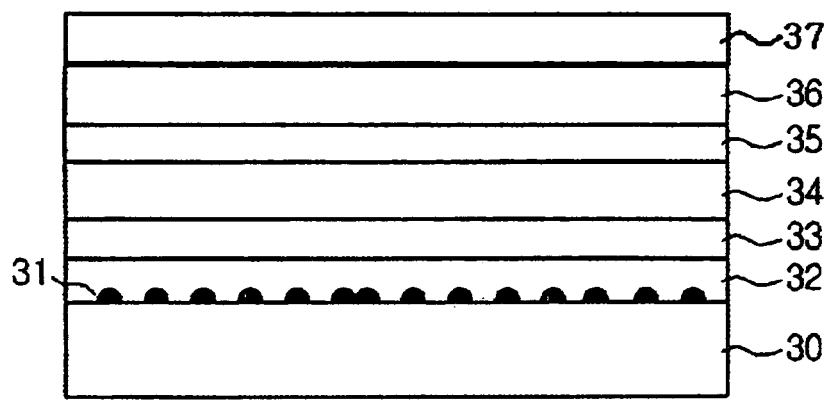

Then, as illustrated in FIGS. 6 to 8, when the amorphous powders 31 are distributed on the substrate 30, a first nitride semiconductor layer is formed on the substrate and the amorphous powders 31. As illustrated in FIGS. 6 to 8, the first nitride semiconductor layer includes a nitride buffer layer 32, an undoped nitride semiconductor layer 33, and an n-type nitride semiconductor layer 34.

To be specific, processes of forming the first nitride semiconductor layer will be described as follows. In the state where the grains of the amorphous powders 31 become solid in the semi-spherical form, as illustrated in FIG. 6, the nitride buffer layer 32 is formed on the amorphous powders 31. The nitride buffer layer 32 can be an InGaN buffer layer having a composition of, for example, $In_{(x)}Ga_{(1-x)}N(0 \leq x \leq 1)$.

Then, as illustrated in FIG. 7, $NH_3$ and trimethal gallium (TMGa) are supplied onto the nitride buffer layer 32 for the substrate 30 on which the nitride buffer layer 32 is formed at the growth temperature of about 600° C. to 800° C. to form the undoped nitride semiconductor layer 33 that does not include dopant on the nitride buffer layer 32 to a predetermined thickness. Here, the undoped nitride semiconductor layer 33 is an undoped GaN layer.

Then, as illustrated in FIG. 8, the n-type nitride semiconductor layer 34 including n-type dopant is formed on the undoped nitride semiconductor layer 33. For example, the n-type nitride semiconductor layer 34 supplies a silane gas including the n-type dopant such as $NH_3$, TMGa, and Si to be formed as an n-type GaN layer.

Then, as illustrated in FIG. 8, an active layer 35 is formed on the n-type nitride semiconductor layer 34.

In order to form the active layer 35, for example, $NH_3$, TMGa, and trimethyl indium (TMIn) are supplied using nitrogen as a carrier gas at a predetermined growth temperature to grow an InGaN layer to a predetermined thickness. At this time, the composition of the InGaN layer may be a stacked structure in which the element components of InGaN are grown with the mole ratios of the element components of the InGaN made different from each other.

As illustrated in FIG. 8, when the active layer 35 is formed, a second nitride semiconductor layer 36 is formed on the active layer. The second nitride semiconductor layer as the p-type nitride semiconductor layer 36 is a p-type GaN layer. Here, in order to form the p-type GaN layer, for example, Mg based second group of elements can be used.

A p-type electrode (not shown) is formed on the p-type nitride semiconductor layer 36 and parts of the p-type nitride semiconductor layer 36, the active layer 35, and the n-type nitride semiconductor layer 34 are etched to partially expose the n-type nitride semiconductor layer 34 so that an n-type electrode (not shown) is formed to be electrically connected to the n-type nitride semiconductor layer 34.

Here, according to a first embodiment of the present invention, a thin n-type nitride semiconductor layer (n-GaN) 37 is further grown on the p-type nitride semiconductor layer 36 so that an npn structured nitride semiconductor light emitting device can be provided.

Figure 1:
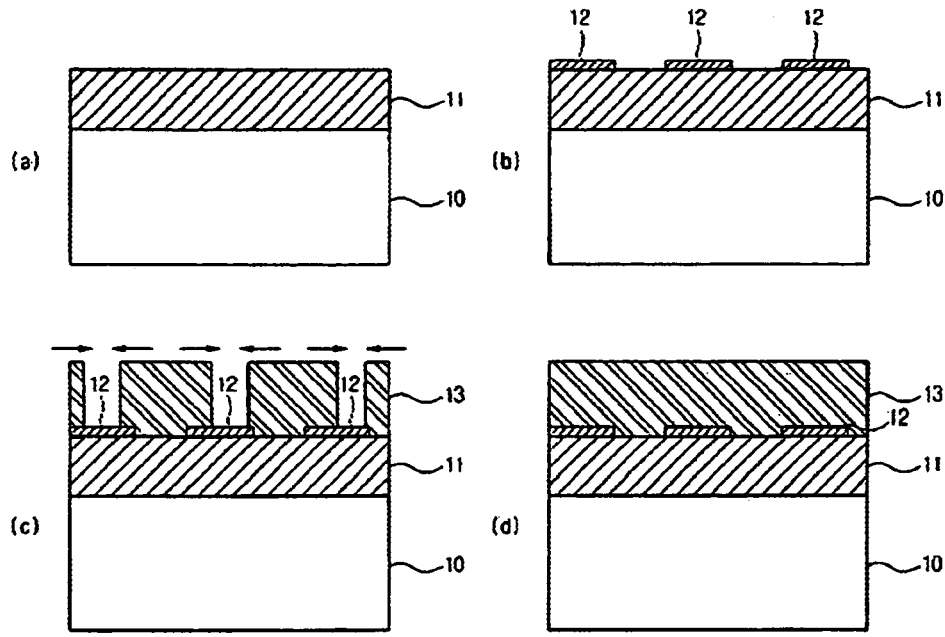
FIGS. 1A to 1D are sectional views illustrating the manufacturing processes of a conventional nitride semiconductor light emitting device.
Figure 2:
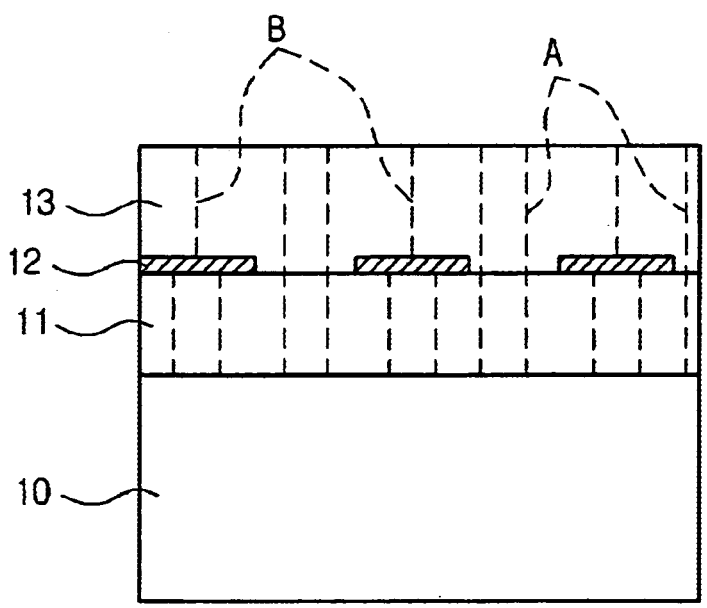
FIG. 2 is a sectional view illustrating the generation of dislocation in a conventional nitride semiconductor light emitting device.

Therefore, in the nitride semiconductor light emitting device according to the first embodiment of the present invention and the method of manufacturing the same, it is possible to prevent the dislocation from being transmitted to the nitride buffer layer 32 by the grains of the semi-spherical Fe based amorphous powders 31. Unlike in the conventional method of preventing the generation of the dislocation that was described with reference to FIGS. 1 and 2, simple processes can be performed. That is, when the grains of the Fe based amorphous powders 31 are attached to the sapphire substrate 30 using the Fe based amorphous powders 31, it is possible to reduce the transmission of the dislocation by no less than about 100 times only by a simple process of depositing the GaN on the Fe based amorphous powders 31.

(Second Embodiment)

Hereinafter, a nitride semiconductor light emitting device according to a second embodiment of the present invention and a method of manufacturing the same will be described.

Figure 9:
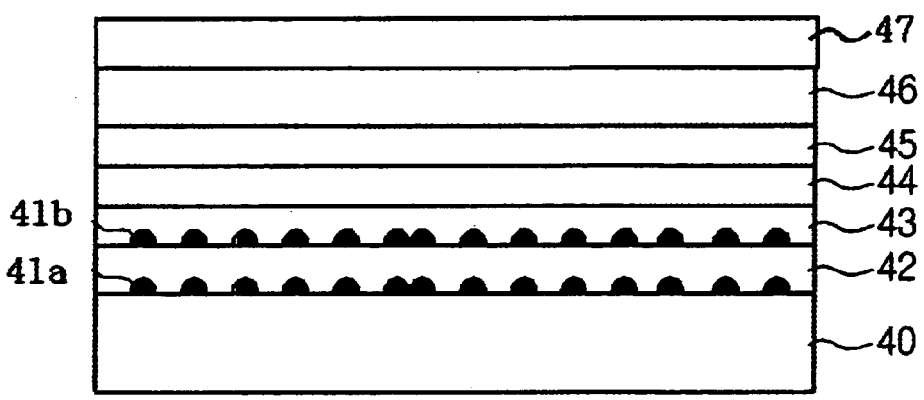
FIG. 9 is a sectional view of a nitride semiconductor light emitting device according to a second embodiment of the present invention.

FIG. 9 is a sectional view of a nitride semiconductor light emitting device according to a second embodiment of the present invention.

As illustrated in FIG. 9, the nitride semiconductor light emitting device according to the second embodiment of the present invention includes a substrate 40 of a nitride semiconductor light emitting device, a nitride buffer layer 42, first amorphous powders 41a formed on the nitride buffer layer 42, an undoped nitride semiconductor layer 43, and second amorphous powders 41b formed on the undoped nitride semiconductor layer 43.

Here, the processes of forming the nitride buffer layer 32 and the undoped nitride semiconductor layer 33 of the nitride semiconductor light emitting device according to the above-described first embodiment of the present invention can be adopted as processes of forming the nitride buffer layer 42 and the undoped nitride semiconductor layer 43. After the undoped nitride semiconductor layer 43 is formed, an n-type nitride semiconductor layer 44, an active layer 45, and a p-type nitride semiconductor layer 46 can be sequentially formed on the undoped nitride semiconductor layer 43.

Also, according to the present invention, a thin n-type nitride semiconductor layer (n-GaN) 47 can be further grown on the p-type nitride semiconductor layer 46 so that the npn-structured nitride semiconductor light emitting device can be provided.

According to the second embodiment of the present invention, when the grains of the Fe based amorphous powders 41a and 41b are formed on the substrate 40, the nitride buffer layer 42, and the undoped nitride semiconductor layer 43, the sizes, the distribution densities, and the heat treatment temperatures of the grains of the Fe based amorphous powders 41a and 41b can change in accordance with the materials of the respective layers.

To be specific, the size of the grains of the second amorphous powders 41b of the undoped nitride semiconductor layer 43 can be smaller than the size of the grains of the first amorphous powders 41a of the nitride buffer layer 42.

Also, the first amorphous powders 41a on the substrate 40 formed in the nitride buffer layer 42 occupy the distribution density of about 20% to 40% for the area of the substrate 30. However, the second amorphous powders 41b of the undoped nitride semiconductor layer 43 are distributed by no more than about 30% for the area of the undoped nitride semiconductor layer 43. Therefore, the heat treatment temperature of the second amorphous powders 41b of the undoped nitride semiconductor layer 43 can be: set to be no more than about 400° C.

As described above, the grains of the second amorphous powders 41b are formed on the nitride buffer layer 42 to be semi-spherical so that it is possible to prevent the dislocation from being transmitted from the undoped nitride semiconductor layer 43 to the n-type nitride semiconductor layer 44 and the active layer 45.

Also, amorphous powders can be distributed in at least one of the nitride buffer layer and the undoped nitride semiconductor layer or on the respective layers or the substrate.

Therefore, since the grains of the Fe based amorphous powders 41a and 41b are formed on the respective nitride semiconductor layers or the substrate to be semi-spherical so that it is effectively prevent the dislocation from being transmitted between the respective layers, it is possible to improve the durability of the nitride semiconductor light emitting device and to reduce leakage current.

As described above, according to the present invention, it is possible to form a high quality nitride semiconductor light emitting device by preventing the dislocation generated in the nitride layer from being transmitted so that it is possible to improve the durability of the nitride semiconductor light emitting device and to reduce the leakage current.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A nitride semiconductor light emitting device, comprising:
    a substrate;
    a first nitride semiconductor layer including an amorphous structure on the substrate, the amorphous structure directly in contact with the substrate;
    an active layer on the first nitride semiconductor layer; and
    a second nitride semiconductor layer on the active layer.

2. The nitride semiconductor light emitting device of claim 1, wherein the amorphous structure comprises a Fe based amorphous structure.

3. The nitride semiconductor light emitting device of claim 1, wherein the amorphous structure comprises a Fe based amorphous structure having a composition of Fe—Si—B.

4. The nitride semiconductor light emitting device of claim 1, wherein the first nitride semiconductor layer comprises:
    a nitride buffer layer and an undoped nitride semiconductor layer in which dopant is not doped on the nitride buffer layer; and
    an n-type nitride semiconductor layer on the undoped nitride semiconductor layer,
    wherein the amorphous structure is provided on at least one of the nitride buffer layer, the undoped nitride semiconductor layer and the n-type nitride semiconductor layer.

5. The nitride semiconductor light emitting device of claim 1, further comprising:
    a third nitride semiconductor layer including an n-type nitride semiconductor and provided on the second nitride semiconductor layer,
    wherein the first nitride semiconductor layer comprises a first N-type nitride semiconductor layer,
    wherein the second nitride semiconductor layer comprises a P-type nitride semiconductor layer, and
    wherein the third nitride semiconductor layer comprises a second N-type nitride semiconductor layer.

6. The nitride semiconductor light emitting device of claim 1, wherein semi-spherical grains are non-uniformly distributed in the amorphous structure.

7. The nitride semiconductor light emitting device of claim 1, wherein the amorphous structure has a distribution density of about 20% to 40% for an area of the first nitride semiconductor layer.

8. The nitride semiconductor light emitting device of claim 1, wherein the second nitride semiconductor layer comprises a p-type nitride semiconductor layer.

9. The nitride semiconductor light emitting device of claim 1, wherein the first nitride semiconductor layer comprises:
   a nitride buffer layer;
   an undoped nitride semiconductor layer on the nitride buffer layer; and
   an n-type nitride semiconductor layer on the undoped nitride semiconductor layer, and
   wherein the amorphous structure includes:
      a first amorphous structure on the nitride buffer layer; and
      a second amorphous structure on the undoped nitride semiconductor layer.

10. The nitride semiconductor light emitting device of claim 9,
   wherein the first and second amorphous structures each comprise grains, and
   wherein a size of the grains of the second amorphous structure is smaller than a size of the grains of the first amorphous structure.

11. The nitride semiconductor light emitting device of claim 1, wherein the amorphous structure comprises at least two separated amorphous structures.

12. The nitride semiconductor light emitting device of claim 1,
   wherein the amorphous structure comprises grains which have a size of about 5 µm to 10 µm and are sprayed onto the substrate so that a distribution density of the amorphous structure occupies about 20% to 40% of an area of the substrate.

13. The nitride semiconductor light emitting device of claim 1,
   wherein the amorphous structure is combined with a top surface of the substrate in a non-uniform state.

14. The nitride semiconductor light emitting device of claim 1,
   wherein the amorphous structure is combined with a top surface of the substrate in a uniform state.

15. A nitride semiconductor light emitting device, comprising:
   a substrate;
   a first nitride semiconductor layer including a Fe based amorphous structure on the substrate, the Fe based amorphous structure directly in contact with the substrate;
   an active layer on the first nitride semiconductor layer; and
   a second nitride semiconductor layer on the active layer.

16. The nitride semiconductor light emitting device of claim 15, wherein the Fe based amorphous structure has a composition of Fe—Si—B.

17. A nitride semiconductor light emitting device, comprising:
   a substrate;
   a first nitride semiconductor layer including an amorphous structure having a size of about 5 µm to about 10 µm on the substrate, the amorphous structure directly in contact with the substrate;
   an active layer on the first nitride semiconductor layer; and
   a second nitride semiconductor layer on the active layer.

18. A nitride semiconductor light emitting device, comprising:
   a substrate;
   a first nitride semiconductor layer including an amorphous structure on the substrate, the amorphous structure directly in contact with the substrate;
   an active layer on the first nitride semiconductor layer;
   a second nitride semiconductor layer on the active layer; and
   a third nitride semiconductor layer on the second nitride semiconductor layer,
wherein the first nitride semiconductor layer comprises a first N-type nitride semiconductor layer, wherein the second nitride semiconductor layer comprises a P-type nitride semiconductor layer, and wherein the third nitride semiconductor layer comprises a second N-type nitride semiconductor layer.

19. A nitride semiconductor light emitting device, comprising:
   a substrate;
   a first nitride semiconductor layer including an amorphous structure having hemispherical grains on the substrate, the amorphous structure directly in contact with the substrate;
   an active layer on the first nitride semiconductor layer; and
   a second nitride semiconductor layer on the active layer.

* * * * *